United States Patent
Uryu

(10) Patent No.: US 11,431,237 B2
(45) Date of Patent: Aug. 30, 2022

(54) FILTER MODULE FOR POWER CONVERSION DEVICE

(71) Applicant: Mitsubishi Electric Corporation, Tokyo (JP)

(72) Inventor: Yuta Uryu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 414 days.

(21) Appl. No.: 16/603,742

(22) PCT Filed: Apr. 20, 2017

(86) PCT No.: PCT/JP2017/015922
§ 371 (c)(1),
(2) Date: Oct. 8, 2019

(87) PCT Pub. No.: WO2018/193589
PCT Pub. Date: Oct. 25, 2018

(65) Prior Publication Data
US 2021/0099072 A1    Apr. 1, 2021

(51) Int. Cl.
*H02M 1/12* (2006.01)
*H01G 2/04* (2006.01)
(Continued)

(52) U.S. Cl.
CPC .............. *H02M 1/126* (2013.01); *H01G 2/04* (2013.01); *H01G 2/106* (2013.01); *H01G 4/38* (2013.01); *H01G 4/40* (2013.01); *H02M 7/003* (2013.01)

(58) Field of Classification Search
CPC ........ H02M 1/12; H02M 1/126; H02M 7/003; H01G 2/04; H01G 2/106; H01G 4/38; H01G 4/40
See application file for complete search history.

(56) References Cited

U.S. PATENT DOCUMENTS

2013/0258602 A1    10/2013  Hatai
2014/0111003 A1    4/2014  Imai et al.
(Continued)

FOREIGN PATENT DOCUMENTS

CN    204271909 U    4/2015
EP    2 708 751 A1    3/2014
(Continued)

OTHER PUBLICATIONS

Anonymous: "Potting (electronics)—Wikipedia", Nov. 27, 2019, XP055873237, Retrieved from the Internet: URL:https://en.wikipedia.org/w/index.php?title=Potting_(electronics)&oldid=928206356 [retrieved on Dec. 15, 2021] (2 pages total).

(Continued)

*Primary Examiner* — Adolf D Berhane
(74) *Attorney, Agent, or Firm* — Sughrue Mion, PLLC; Richard C. Turner

(57) ABSTRACT

A filter module for a power conversion device, including: a capacitor module, an inductor module, and a case member, wherein the capacitor module includes: a positive-electrode side bus bar in which a positive-electrode terminal is formed, a negative-electrode side bus bar in which a negative-electrode terminal is formed, and a plurality of capacitor elements connected to the positive-electrode side bus bar and the negative-electrode side bus bar, respectively, wherein the inductor module includes: an inductor bus bar, and a magnetic member through which the inductor bus bar is inserted, and wherein the case member includes: a first space in which the capacitor module is accommodated, and a second space in which the inductor module is accommodated.

21 Claims, 17 Drawing Sheets

(51) Int. Cl.
*H01G 2/10* (2006.01)
*H01G 4/38* (2006.01)
*H01G 4/40* (2006.01)
*H02M 7/00* (2006.01)

(56) References Cited

U.S. PATENT DOCUMENTS

| | | | |
|---|---|---|---|
| 2015/0008989 A1 | 1/2015 | Aizawa | |
| 2016/0073556 A1 | 3/2016 | Nakasaka | |
| 2016/0095267 A1 | 3/2016 | Kitazaki et al. | |
| 2020/0162051 A1* | 5/2020 | Taniguchi | H03H 7/0153 |

FOREIGN PATENT DOCUMENTS

| | | |
|---|---|---|
| JP | 9-285125 A | 10/1997 |
| JP | 2004-296813 A | 10/2004 |
| JP | 2005-093536 A | 4/2005 |
| JP | 2007-143272 A | 6/2007 |
| JP | 2014-39384 A | 2/2014 |
| JP | 2014-082894 A | 5/2014 |
| JP | 2015-035862 A | 2/2015 |
| JP | 2015-177585 A | 10/2015 |
| JP | 2016-039699 A | 3/2016 |
| JP | 2016-058688 A | 4/2016 |
| JP | 2016-100913 A | 5/2016 |
| JP | 2016-165203 A | 9/2016 |
| WO | 2015/059552 A1 | 4/2015 |

OTHER PUBLICATIONS

Communication dated Dec. 23, 2021 from the European Patent Office in EP Application No. 17 906 715.2.
International Search Report for PCT/JP2017/015922 dated Jun. 27, 2017 [PCT/ISA/210].
Communication dated Mar. 31, 2020 from European Patent Office in EP Application No. 17906715.2.

* cited by examiner

FILTER MODULE FOR POWER CONVERSION DEVICE

CROSS REFERENCE TO RELATED APPLICATIONS

This application is a National Stage of International Application No. PCT/JP2017/015922 filed Apr. 20, 2017.

TECHNICAL FIELD

The present invention relates to, for example, an output filter for a power conversion device to be mounted to a vehicle which employs a motor as one of driving sources.

BACKGROUND ART

Hitherto, a DC/DC converter, which is a power conversion device to be mounted to an electric vehicle or a hybrid vehicle, is configured to step down a high voltage electric power, which is supplied from a battery for driving the vehicle, to a working voltage of auxiliary electrical components while insulating the high voltage electric power. In the step-down DC/DC converter, a high voltage is applied to a primary-side circuit, and a large current is caused to flow at a secondary-side circuit. Therefore, a configuration which dissipates heat of the components, and a configuration which secures insulation distances between the components, are required so that downsizing of the device is difficult to achieve.

Further, in the DC/DC converter, a surge voltage is generated due to parasitic inductance present in wirings in the circuits to cause power semiconductor devices to malfunction in some cases. The surge voltage is superimposed on a voltage to be output, resulting in failure of the auxiliary electrical components and peripheral devices to be powered. To suppress the surge voltage, a configuration, which can reduce parasitic inductance of a component such as a smoothing capacitor forming the DC/DC converter, is required to be provided, or an output filter is required to be added.

Therefore, there is disclosed a configuration, in which a first wide conductor and a second wide conductor to be connected to a plurality of capacitor elements are laminated via an insulating sheet, and are conducted in reverse directions to each other so as to cancel magnetic flux, and hence parasitic inductance can be reduced (for example, see Patent Literature 1).

CITATION LIST

Patent Literature

[PTL 1] JP 2007-143272 A

SUMMARY OF INVENTION

Technical Problem

With a method of Patent Literature 1, parasitic inductance cannot be completely eliminated so that an output filter including an inductor and a capacitor is required to be added. When the output filter is added, an inductor and a capacitor as filter components are typically added to an existing configuration. Therefore, a configuration for holding the inductor and the capacitor, and a clearance for wiring and insulation are required to be secured in addition to a space for arranging the additional component.

However, downsizing of the power conversion device is required so that a size of a housing cannot be increased. To reduce the size of the power conversion device and to add the filter member, downsizing of the existing components is required, and hence there is a problem of an increase in cost associated with an alteration in design.

The present invention has been made to solve the above-mentioned problems, and is intended to obtain a filter module for a power conversion device, in which downsizing of existing components is not required, downsizing of the power conversion device is achieved, and an inductor for a surge voltage and noise can be added.

Solution to Problem

A filter module for a power conversion device according to one embodiment of the present invention includes: a capacitor module, an inductor module, and a case member, wherein the capacitor module includes: a positive-electrode side bus bar in which a positive-electrode terminal is formed, a negative-electrode side bus bar in which a negative-electrode terminal is formed, and a plurality of capacitor elements connected to the positive-electrode side bus bar and the negative-electrode side bus bar, respectively, wherein the inductor module includes: an inductor bus bar, and a magnetic member through which the inductor bus bar is inserted, and wherein the case member includes: a first space in which the capacitor module is accommodated, and a second space in which the inductor module is accommodated.

Advantageous Effects of Invention

According to the filter module of the power conversion device of the present invention, the existing components are integrated with the additional component. Accordingly, a size of the housing of the existing power conversion device is not increased, the downsizing of the existing components and a large alteration in layout for the existing components are not required, and the additional filter component can be arranged in the existing power conversion device.

DESCRIPTION OF EMBODIMENTS

Now, with reference to the drawings, a filter module for a power conversion device according to exemplary embodiments of the present invention is described.

First Embodiment

Figure 1:
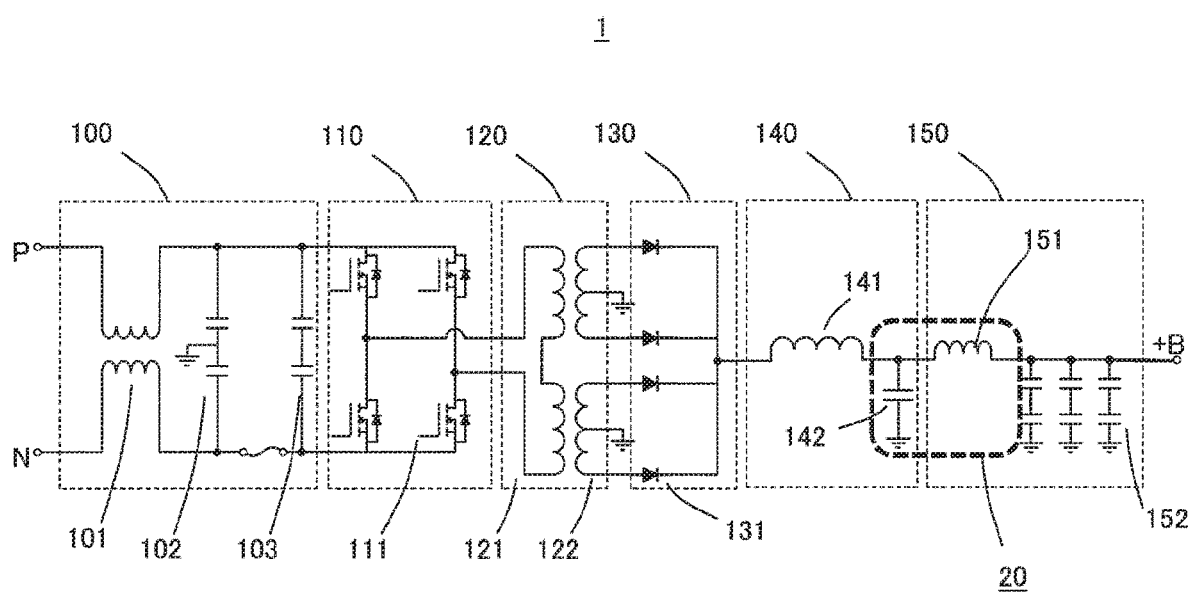
FIG. 1 is a circuit diagram of a power conversion device including a filter module according to a first embodiment of the present invention.

FIG. 1 is a circuit diagram of a power conversion device 1 as an insulated DC/DC converter including a filter module 20 according to a first embodiment of the present invention.

As illustrated in FIC, 1, the power conversion device 1 includes an input filter circuit unit 100, a switching circuit unit 110, a transformer unit 120, a rectifier circuit unit 130, a smoothing circuit unit 140, and a filter circuit unit 150.

The input filter circuit unit 100 includes common mode choke coils 101, and capacitors 102 and 103, and is configured to eliminate surge components in a specific frequency input from a PN line.

The switching circuit unit 110 includes switching elements 111 of a plurality of MOSFETs or IGBTs, and is configured to convert an input DC voltage applied between the PN into an AC voltage.

The transformer unit 120 includes a primary-side high voltage coil 121 and a secondary-side low voltage coil 122, and is configured to step down a high input voltage converted into the AC voltage in the switching circuit unit 110 to drive voltages of auxiliary machines and electrical devices in a vehicle so as to output to the rectifier circuit unit 130, while insulating the high voltage electric power. The primary-side high voltage coil 121 has more turns than the secondary-side low voltage coil 122, and a transformation ratio is determined based on a turn ratio of those coils.

The rectifier circuit unit 130 includes a plurality of diodes 131 as rectifying elements, and is configured to convert the low AC voltage output from the secondary-side low voltage coil 122 of the transformer unit 120 into a DC voltage.

The smoothing circuit unit 140 includes a smoothing reactor 141 and a smoothing capacitor 142, and is configured to smoothen the DC voltage rectified in the rectifier circuit unit 130 so as to output to the filter circuit unit 150. The smoothing capacitor 142 is inserted between the smoothing reactor 141 and an output terminal, and a negative-electrode side terminal of the smoothing capacitor 142 is grounded to a GND portion.

The filter circuit unit 150 includes an inductor 151 and capacitors 152, and is configured to eliminate a surge voltage superimposed on an output voltage.

With the above-mentioned configuration, the power conversion device 1 as an insulated DC/DC converter steps down, for example, an input DC voltage ranging from 100V to 500V to DC voltages ranging from 12V to 16V as driving voltages of the auxiliary machines and the electrical components in the vehicle to output.

The input filter circuit unit 100, the switching circuit unit 110, the transformer unit 120, the rectifier circuit unit 130, the smoothing circuit 140, and the filter circuit unit 150 are fixed to a housing including a cooler, which is not illustrated, formed by aluminum die casting or the like. The housing itself functions as a heat dissipation member of each component to be mounted, and a GND ground line.

Next, with reference to FIG. 2 to FIG. 19, a description is given of the filter module 20 of the power conversion device 1 according to the first embodiment in detail.

Figure 2:
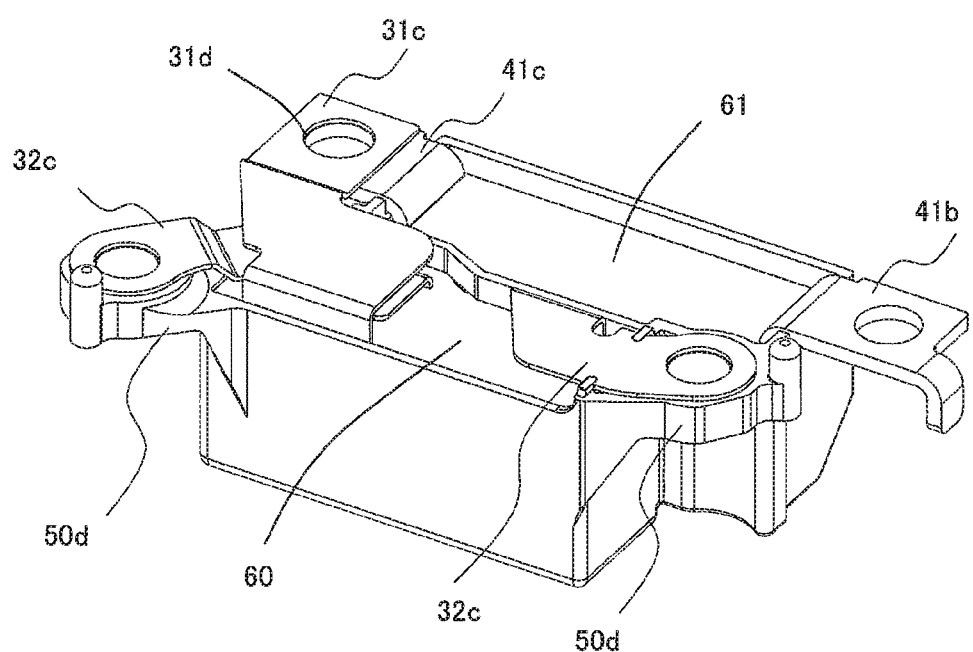
FIG. 2 is a perspective view of the filter module of the power conversion device according to the first embodiment of the present invention, when viewed from a bottom side.
Figure 3:
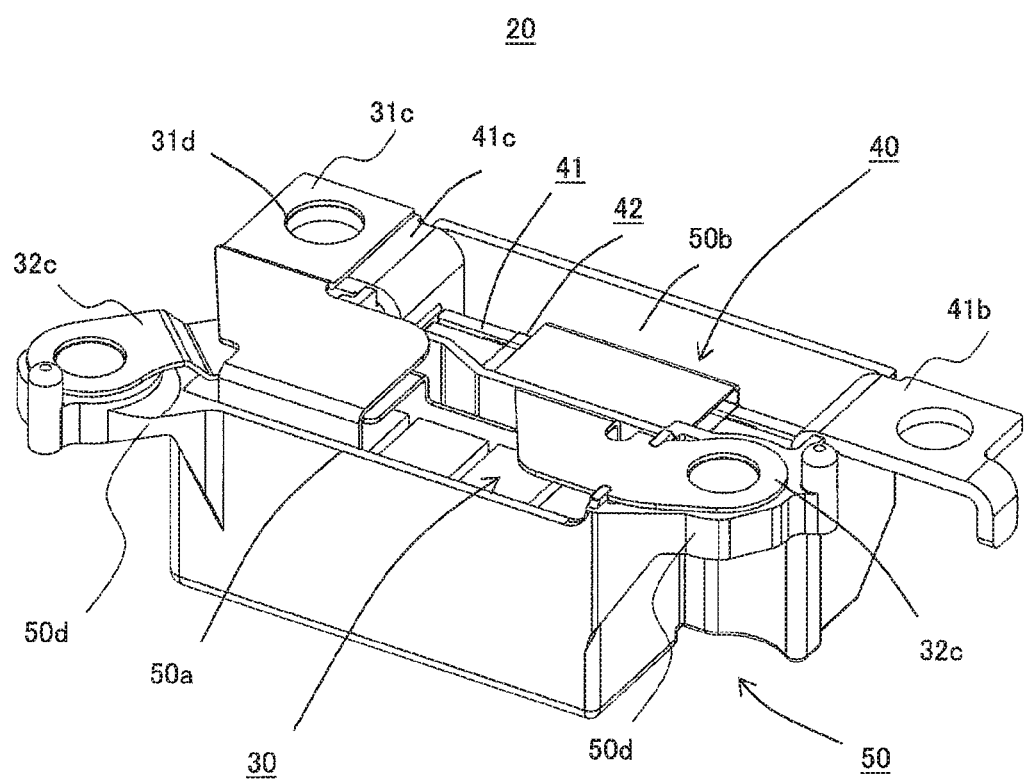
FIG. 3 is a view of the filter module of FIG. 2 from which potting materials are removed.

FIG. 2 is a perspective view of the filter module 20 according to the first embodiment, when viewed from a bottom side as a mount surface side. FIG. 3 is a view of the filter module 20 from which potting materials are removed. Further, FIG. 4 is an exploded view of the filter module 20.

Figure 4:
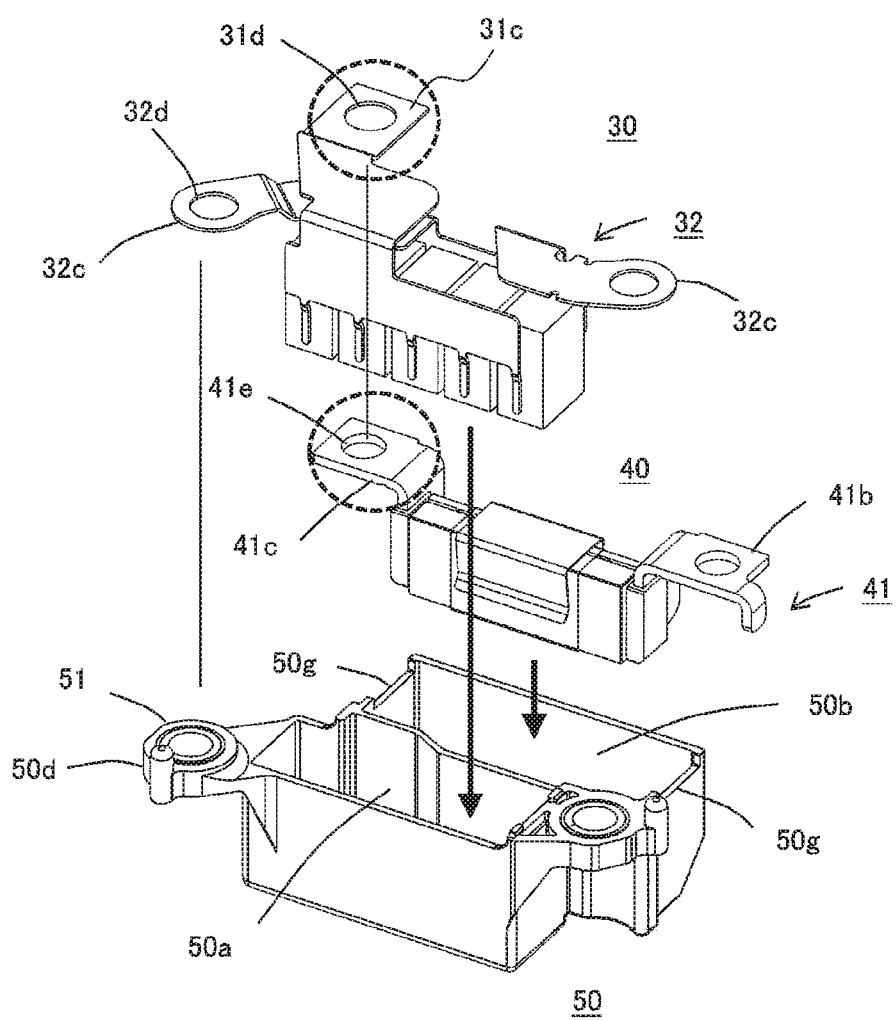
FIG. 4 is an exploded view of the filter module of the first embodiment.

As illustrated in FIG. 2 to FIG. 4, the filter module 20 includes a case 50, a capacitor module 30 as the smooth capacitor 142, and an inductor module 40 as the inductor 151. As illustrated in FIG. 4, the case 50 includes a first space 50a and a second space 50b. The capacitor module 30 is accommodated and a potting material 60 is filled in the first space 50a, and, the inductor module 40 is accommodated and a potting material 61 is filled in the second space 50b.

Figure 5:
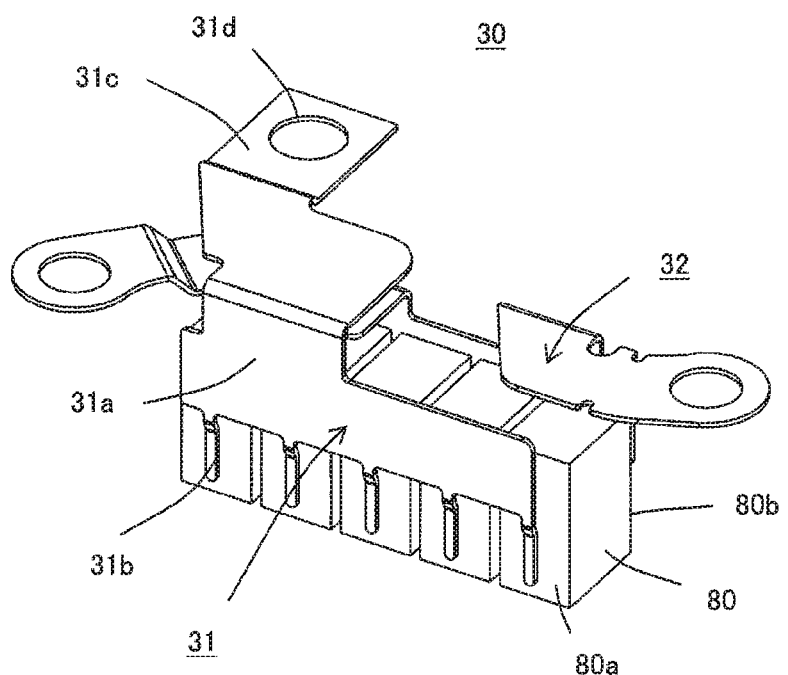
FIG. 5 is a view for illustrating a capacitor module forming the filter module of the first embodiment.

FIG. 5 is a view for illustrating the capacitor module 30 forming the filter module 20 of the first embodiment. As illustrated in FIG. 5, the capacitor module 30 includes five capacitor elements 80, a positive-electrode side bus bar 31, and a negative-electrode side bus bar 32. The capacitor elements 80 form film capacitors, in which plastic films having a deposited metal are laminated, and which include electrodes formed on terminal bonding surfaces by metal spraying. The positive-electrode side bus bar 31 and the negative-electrode side bus bar 32 are made of a copper material, and metal plating is applied thereon to increase bondability with the capacitor elements 80.

The number of capacitor elements 80 is not limited to five, and is appropriately determined by capacitance (electrostatic capacitance) required for the power conversion device 1. Further, a type of the capacitor elements 80 is not limited to a film capacitor, and capacitors other than the film capacitors may be used as long as the capacitors have predetermined capacitance. Still further, a material of the positive-electrode side bus bar 31 and the negative-electrode side bus bar 32 is not limited to a copper material as long as the material has predetermined electric resistivity.

As illustrated in FIG. 5, the positive-electrode side bus bar 31 includes a body portion 31a, five bonding portions 31b, and a fixing portion 31c. The five bonding portions 31b are formed to extend to a lower side of the body portion 31a, and are bonded to positive-electrode sides of the five capacitor elements 80. The fixing portion 31c extends to an upper side of the body portion 31a, and is bent toward the negative-electrode side bus bar 32 side to be formed to cross the negative-electrode side bus bar 32 above the negative-electrode side bus bar 32. Further, the fixing portion 31c has a through hole 31d through which a fastening member such as a screw is inserted.

Figure 6:
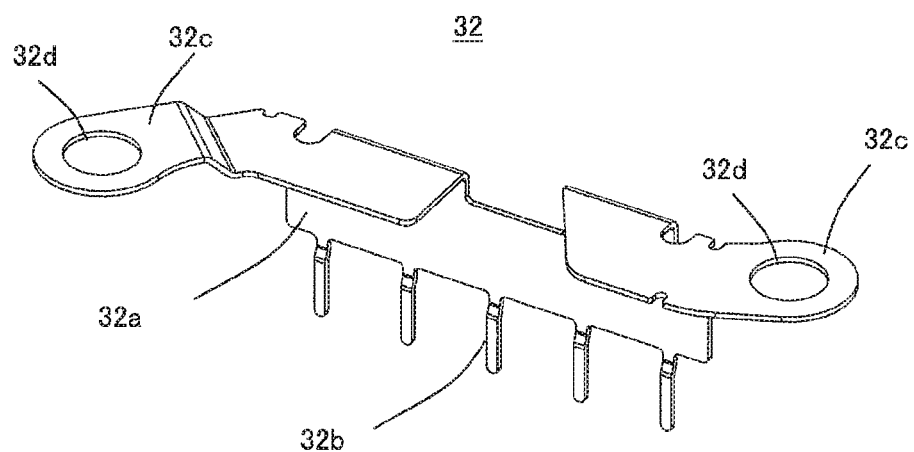
FIG. 6 is a view for illustrating a negative-electrode side bus bar of the capacitor module of FIG. 5.

FIG. a view for illustrating the negative-electrode side bus bar 32 in the capacitor module 30 of FIG. 5. As illustrated in FIG. 6, the negative-electrode side bus bar 32 includes a body portion 32a, five bonding portions 32b, and two fixing portions 32c. The five bonding portions 32b are formed to extend to a lower side of the body portion 32a, and are bonded to negative-electrode sides of the five capacitor elements 80, respectively. The two fixing portions 32c are formed to extend to sides of the body portion 32a, and have through holes 32d through which fastening members such as screws are inserted.

As illustrated in FIG. 5, in the capacitor module 30, the positive-electrode side bus bar 31 and the negative-electrode side bus bar 32 are arranged in a state of being faced to each other through intermediation of the five capacitor elements 80. The five bonding portions 31b of the positive-electrode side bus bar 31 are each bonded to electrode surfaces 80a of the five capacitor elements 80 by welding or soldering, and five bonding portions 32b of the negative-electrode side bus bar 32 are each bonded to electrode surfaces 80b of the five capacitor elements 30 by welding or soldering.

The capacitor module 30 thus formed as the smoothing capacitor 142 stores electric power, in which, after the voltage thereof is rectified, the current thereof is smoothed by the smoothing reactor 141, and smooths an output voltage based on capacitance.

Figure 7:
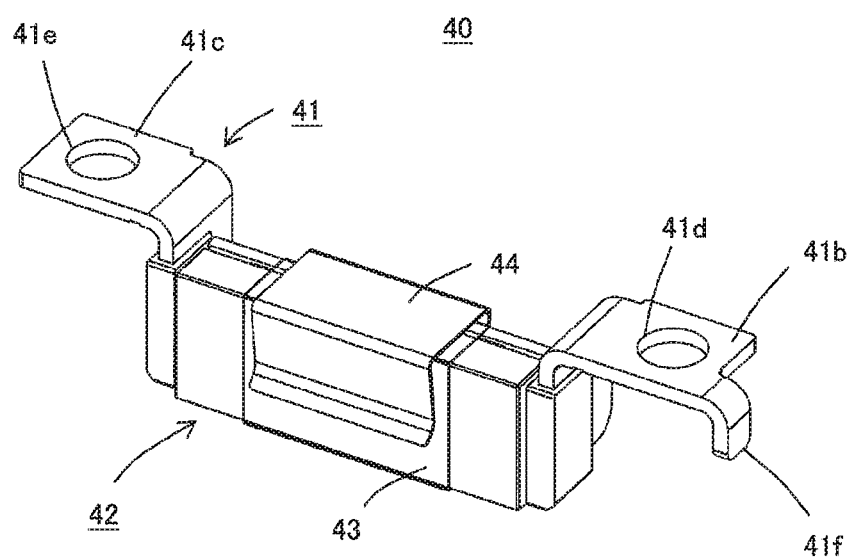
FIG. 7 is a view for illustrating an inductor module forming the filter module of the first embodiment.

FIG. 7 is a perspective view of the inductor module 40 as the inductor 151 forming the filter module 20. As illustrated in FIG. 7, the inductor module 40 includes an inductor bus bar 41, a core 42, a tape 43, and a clip 44.

Figure 8:
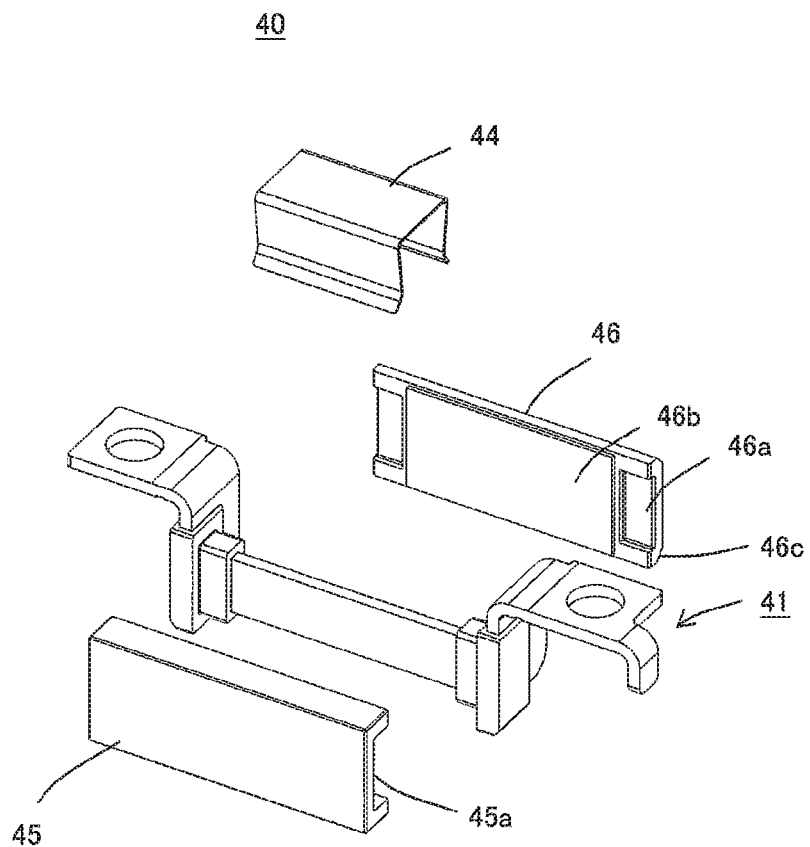
FIG. 8 is an exploded view of the inductor module of FIG. 7.

FIG. 8 is an exploded view of the inductor module 40 of FIG. 7. Further, FIG. 9 is a view for illustrating the inductor bus bar 41 forming the inductor module 40, and FIG. 10 is a view for illustrating the core 42.

Figure 9:
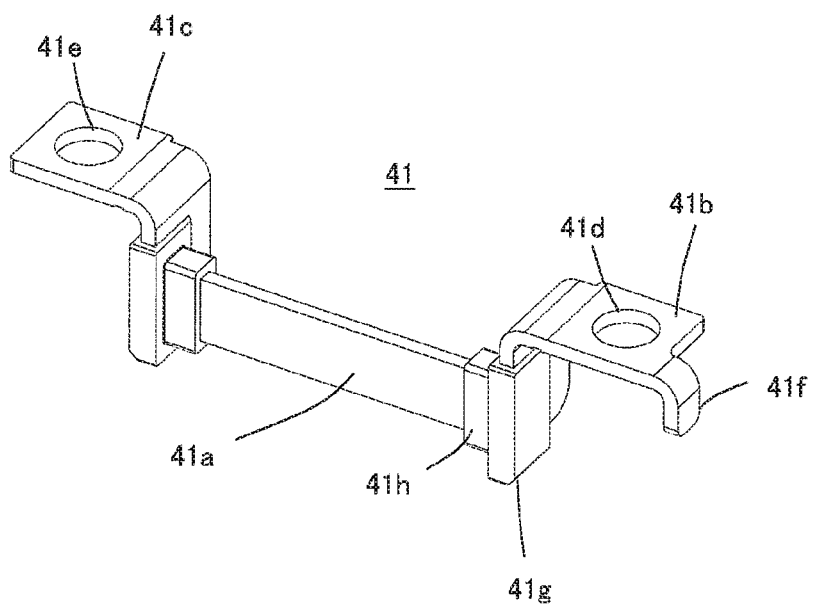
FIG. 9 is a view for illustrating an inductor bus bar forming the inductor module of FIG. 7.

As illustrated in FIG. 9, the inductor bus bar 41 is formed by a bus bar made of a copper material, which is formed integrally with resin portions 41g by insert-molding. The inductor bus bar 41 includes a straight portion 41a, two flat portions 41b and 41c, and a rising portion 41f formed by a bent portion of the flat portion 41b. Further, the flat portions 41b and 41c each have through holes 41d and 41e.

The resin portions 41g are made of resin such as PPS or PBT having an insulating property, and cover both end portions of the straight portion 41a. The material of the bus bar is not limited to copper as long as the material is a metal material having predetermined electric resistivity.

Figure 10:
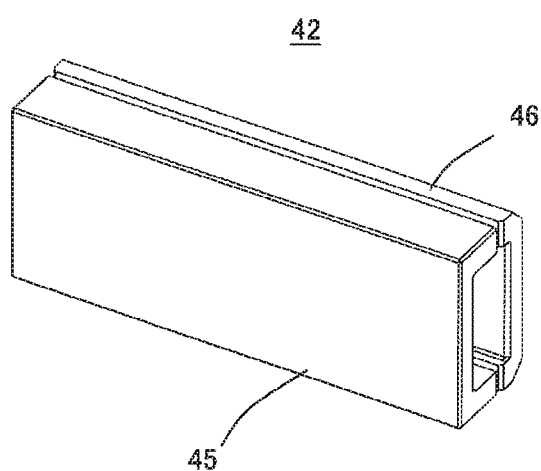
FIG. 10 is a view for illustrating a core member forming the inductor module of FIG. 7.

As illustrated in FIG. 8 and FIG. 10, the core 42 includes a U-shaped core 45 and an I-shaped core 46. The U-shaped core 45 and the I-shaped core 46 are made of ferrite. As illustrated in FIG. 8, the U-shaped core 45 has stepped portions 45a, and the I-shaped core 46 has stepped portions 45a. Further, the I-shaped core 46 has chamfered portions 46c corresponding to a shape of the case 50.

Further, the I-shaped core 46 has a surface, which covers the inductor bus bar 41, on which a gap sheet 46b is bonded. A material of the U-shaped core 45 and the I-shaped core 46 is not limited to ferrite as long as the material is a magnetic material having a predetermined magnetic property.

The clip 44 is a spring member formed of a stainless steel plate having constant strength. A material of the clip 44 is not limited to a stainless steel and may be iron or nonmetal such as resin as long as the material has predetermined elasticity and strength.

The tape 43 is an adhesive tape having an adhesive on a base material made of resin. For example, a polyester film tape is used as the tape 43.

The inductor bus bar 41 is sandwiched between the U-shaped core 45 and the I-shaped core 46, is wound with the tape 43, and is fitted with the clip 44 so as to form the inductor module 40.

The inductor module 40 thus formed has inductance and impedance, which are determined by a cross-sectional area and a length of a longitudinal direction of the core 42 covering the bus bar, and functions as an inductor. Further, with an arrangement of the gap sheet 46b on the core 42, the inductor has a superimposing property corresponding to current.

The inductor module 40 eliminates surge components in a specific frequency band, which causes noise superimposed on the voltage smoothed in the smoothing capacitor 142, based on the impedance of the inductor module 40.

Figure 11:
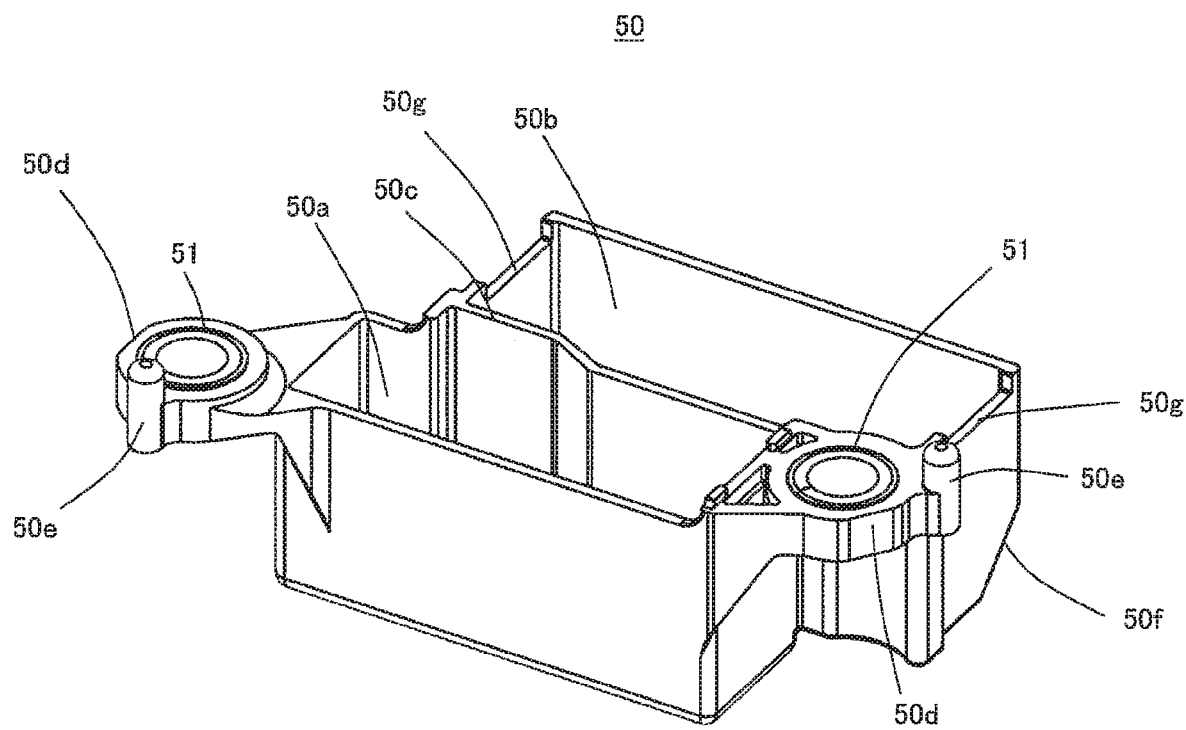
FIG. 11 is a perspective view of a case member forming the filter module of the first embodiment.

FIG. 11 is a perspective view of the case 50. As illustrated in FIG. 11, the case 50 has a first space 50a and a second space 50b. A wall 50c is formed between the first space 50a and the second space 50b.

The capacitor module 30 is accommodated in the first space 50a, and the inductor module 40 is accommodated in the second space 50b of the case 50. Notches 50g are each formed on both side surfaces in the longitudinal direction of the second space 50b.

Further, a chamfered portion 50f is formed in a bottom portion of the second space 50b so as not to interfere with peripheral components when the filter module 20 is arranged in the power conversion device 1. The case 50 includes a pair of fixing portions 50d, which extend from side surfaces of the first space 50a. Iron bushes 51 are arranged in the pair of fixing portions 50d. Still further, positioning pins 50e are formed in the two fixing portions 50d, which are each engaged with positioning holes of the housing, which is not shown, of the power conversion device 1.

The case 50 is made of a PPS resin having an insulating property, and the bushes 51 are formed integrally with the case 50 by insert-molding. A material of the case 50 is not limited to PPS, and a material of the bushes 51 is not limited to iron. For example, a material of the case 50 may be resin such as PBT having an insulating property, and a material of the bushes 51 may be stainless steel.

Next, a description is given of assembly of the filter module 20 with reference to the exploded view of FIG. 4.

First, the inductor module 40 is accommodated in the second space 50b of the case 50. The inductor module 40 is accommodated such that the two flat portions 41b and 41c of the inductor bus bar 41 are received in the pair of notches 50g formed in the side surfaces of the second space 50b. The inductor module 40 is positioned in the case 50 by the pair of notches 50g of the second space 50b.

Next, the capacitor module 30 is accommodated in the first space 50a. On this occasion, the fixing portion 31c of the positive-electrode side bus bar 31 of the capacitor module 30 is overlapped with the flat portion 41c of the inductor module 40 illustrated by broken-lined circles of FIG. 4. The through hole 31d is formed in the fixing portion 31c of the positive-electrode side bus bar 31, and a through hole 41e is formed in the flat portion 41c of the inductor module 40. An inner diameter of the through hole 31d is formed larger than an inner diameter of the through hole 41e. When the fixing portion 31c of the positive-electrode side bus bar 31 is overlapped with the flat portion 41c of the inductor module 40, a center of the through hole 31d of the positive-electrode side bus bar 31 is aligned with a center of the through hole 41e of the inductor module 40.

Further, the fixing portions 32c of the negative-electrode side bus bar 32 of the capacitor module 30 are overlapped with the bushes 51 arranged in the fixing portions 50d of the case 50. Inner diameters of the through holes 32d formed in the fixing portions 32c of the negative-electrode side bus bar 32 are formed larger than an inner diameters of the bushes 51. When the fixing portions 32c of the negative-electrode side bus bar 32 are overlapped with the bushes 51, centers of the through holes 32d of the negative-electrode side bus bar 32 are aligned with centers of the bushes 51.

Next, the potting materials are each filled and cured in the first space 50a in which the capacitor module 30 is accommodated, and in the second space 50b in which the inductor module 40 is accommodated. An epoxy-based potting resin is filled in the first space 50a in which the capacitor module 30 is accommodated, and a silicon-based potting resin is filled in the second space 50b in which the inductor module 40 is accommodated.

Thus, the filter module 20 is formed. Next, assembly of the filter module 20 into the power conversion device 1 is described.

Figure 12:
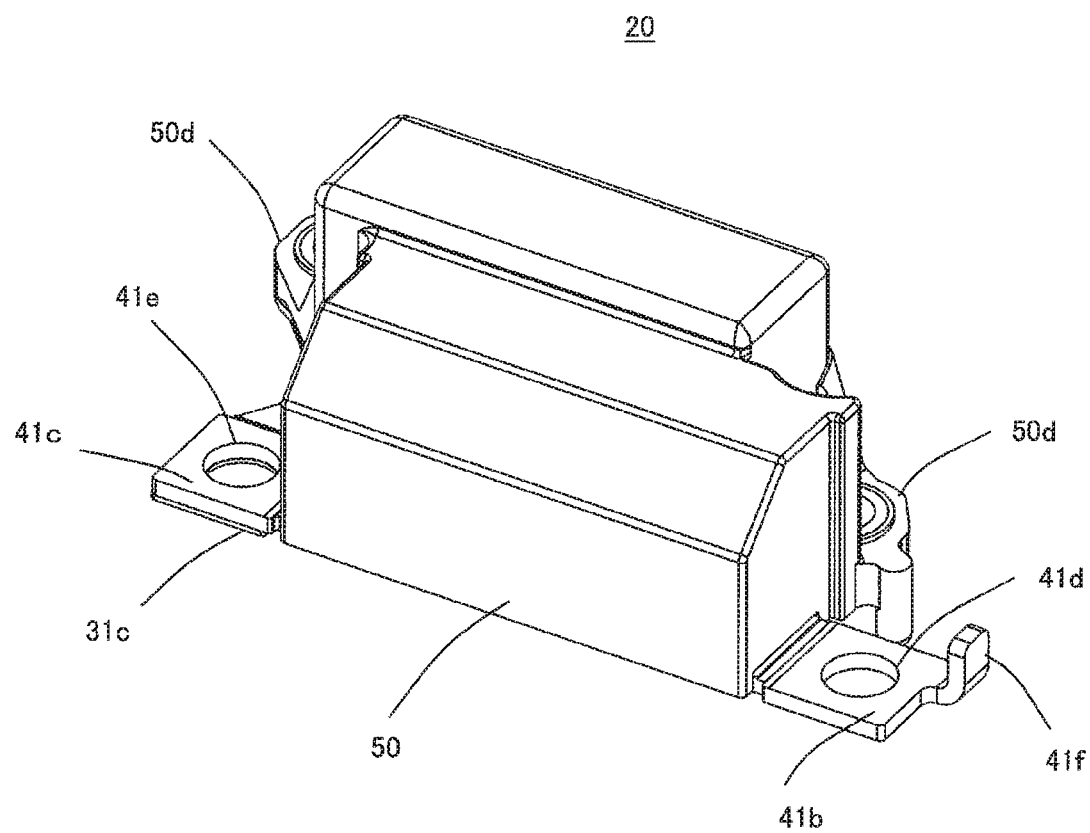
FIG. 12 is a perspective view of the filter module according to the first embodiment of the present invention, when viewed from an upper side.
Figure 13:
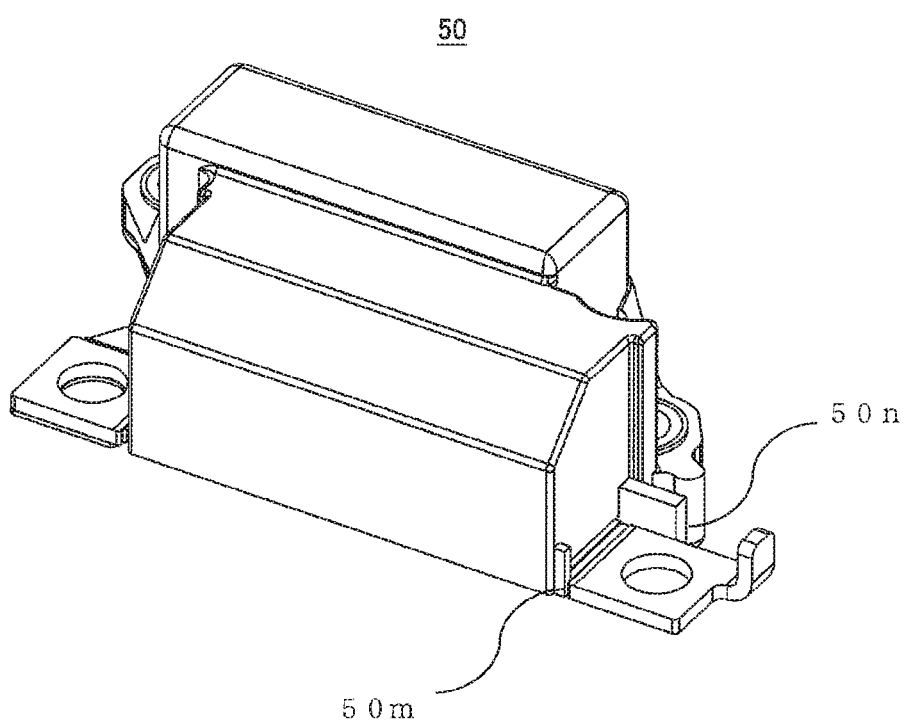
FIG. 13 is a perspective view of a modification example of the filter module according to the first embodiment of the present invention, when viewed from the upper side.

FIG. 12 is a perspective view of the filter module 20, when viewed from an upper side. When the filter module 20 is assembled to the power conversion device 1, as illustrated in FIG. 12, the case 50 is assembled to the housing of the power conversion device 1, which is not shown, in a state in which an opening side of the case 50 is directed to the housing. Fastening members are each inserted in the bushes 51 of the pair of fixing portions 50d of the case 50, and are tightened so that the filter module 20 is fixed to the housing.

As illustrated in FIG. 2, the pair of fixing portions 32c and 32c of the negative-electrode side bus bar 32 of the capacitor module 30 are overlapped with the pair of fixing portions 50d and 50d of the case 50. As a result, when the case 50 is mounted to the housing, the pair of fixing portions 32c and 32c of the negative-electrode side bus bar 32 is fixed in a state of being in contact with the housing.

Meanwhile, the one flat portions 41b of the inductor bus bar 41 in the inductor module 40 is fixed on a wiring bus bar, which is not shown, belonging to the inductor 151 in the circuit of the power conversion device 1 of FIG. 1, and is electrically connected to the wiring bus bar. The flat portion 41c of the inductor bus bar 41 is fixed on a wiring bus bar belonging to the capacitors 152 of the filter circuit portion 150, and is electrically connected to the wiring bus bar. Thus, the filter module 20 is assembled to the power conversion device 1.

According to the filter module 20 thus formed of the power conversion device 1 of the first embodiment, the capacitor module 30 corresponding to the existing smoothing capacitor 142 and the inductor module 4U corresponding to the inductor 151 as an additional component, both of which form the power conversion device 1, are accommodated integrally in the case 50 formed of an insulating member. Thus, when the filter module 20 is assembled to the power conversion device 1, an inductor can be added without a size of the housing of the power conversion device 1 being increased. Further, the existing component and the inductor can be integrated and arranged compactly, with the result that a volume of the components forming the power conversion device 1 can be reduced. As a result, downsizing and a weight reduction of the power conversion device 1 can be achieved. Still further, the plurality of capacitor elements 80 and the inductor module 40 are held in the case 50 so that a member for holding the components can be reduced and manufacturing cost of the power conversion device 1 can be reduced.

Further, in the filter module 20, the negative-electrode side bus bar 32 of the capacitor module 30 is arranged on a side close to the inductor module 40. The negative-electrode side bus bar 32 is connected to the GND of the housing so that, when the inductor module 40 is activated, heat generated from the core 42 and the inductor bus bar 41 can be dissipated to the housing via the negative-electrode side bus bar 32 of the capacitor module 30. Thus, an increase in temperature of the inductor module 40 can be suppressed, and an increase in temperature of the plurality of capacitor elements 80, which are integrated in the case 50, can be suppressed.

Further, heat generated in the capacitor module 30 can be also dissipated to the housing via the negative-electrode side bus bar 32 so that an influence on the inductor module 40 due to the heat generated in the capacitor module 30 can be suppressed. As a result, deterioration in property of the power conversion device 1 due to the increase in temperature can be suppressed, and the power conversion device 1 can be stably operated.

Further, in the capacitor module 30, the positive-electrode side bus bar 31 and the negative-electrode side bus bar 32 are arranged to cross in three-dimension to each other. Thus, the magnetic flux generated by the positive-electrode side bus bar 31 and the negative-electrode side bus bar 32 can be canceled. Accordingly, the parasitic inductance generated by the positive-electrode side bus bar 31 and the negative-electrode side bus bar 32 can be eliminated so that the parasitic inductance of the capacitor module 30 itself and the parasitic inductance of the capacitor elements 80 can be reduced. As a result, suppression of the surge voltage and an EMC property can be improved.

The negative-electrode side bus bar 32 of the capacitor module 30 close to the inductor module 40 has two separated fixing portions 32c. Thus, a cross-sectional area of the negative-electrode side bus bar 32 can be increased, and the parasitic inductance of the negative-electrode side bus bar 32 and the capacitor module 30 can be further reduced. Further, the separated two fixing portions 32c are in contact with the housing so that thermal resistance in a heat dissipation surface can be reduced, and a heat dissipation effect via the negative-electrode side bus bar 32 can be further enhanced.

Further, the negative-electrode side bus bar 32 is connected to the housing while being fixed to the fixing portions 50d of the case 50. Thus, downsizing of the filter module 20 can be achieved so that downsizing of the power conversion device 1 can be achieved. Still further, fastened points are reduced, productivity is improved, and machining cost can be reduced. Yet further, the inner diameters of the through holes 32d of the negative-electrode side bus bar 32 are formed to be larger than the inner diameters of the bushes 51. Thus, in a case in which the filter module 20 is mounted to the housing, even when the centers of the through holes 32d of the negative-electrode side bus bar 32 and the centers of the bushes 51 are shifted from each other, the fixing portions 32c of the negative-electrode side bus bar 32 is cut by fastening members so that generation of conductive foreign substances can be prevented.

Further, the positive-electrode side bus bar 31 of the capacitor module 30 is crossed with the negative-electrode side bus bar 32 across the capacitor module 30, and is connected to the flat portion 41c of the inductor bus bar 41. Accordingly, a length of the inductor bus bar 41 can be increased without increasing the parasitic inductance. As a result, a stress in association with displacement of the inductor bus bar 41 at the time of fixing can be reduced, to thereby improve vibration resistance of the inductor bus bar 41.

Further, in the filter module 20, the fixing portion 31c of the positive-electrode side bus bar 31 is overlapped with the flat portion 41c of the inductor module 40 for fixation. With the configuration, there is no need to add a new fixing portion. As a result, downsizing of the power conversion device 1 can be further achieved. Still further, a fastening process for fixing can be reduced, and an improvement in productivity and a reduction in processing cost can be achieved.

Furthermore, in the filter module 20, the positive-electrode side bus bar 31, which is thinner and weaker than the inductor bus bar 41 of the inductor module 40, is arranged to overlap on the housing side. With the configuration, a deformation of the positive-electrode side bus bar 31, which is caused by contact of the screws at the time of fastening process such as screw fastening, can be suppressed. In the first embodiment, the inductor bus bar 41 is made thicker than the positive-electrode side bus bar 31, but the present invention is not limited thereto. For example, the positive-electrode side bus bar 31 may be made thicker than the inductor bus bar 41, and the arrangement thereof may be reversed. Still further, at the time of fastening process, when there is a fear in that the inductor bus bar 41 or the positive-electrode side bus bar 31 is rotated and deformed, protruding portions 50m and 50n, which prevent rotation of the inductor bus bar 41 or the positive-electrode side bus bar 31, may be formed in the case 50 as illustrated in a modification example of FIG. 13.

Further, in the filter module 20, the inner diameter of the through hole 31d formed in the fixing portion 31c of the positive-electrode side bus bar 31 is preliminary formed larger than the inner diameter of the through hole 41e of the inductor bus bar 41. With the configuration, at the time of fastening process, even when the center of the through hole 41e of the inductor bus bar 41 and the position of the through hole 31d of the positive-electrode side bus bar 31 are shifted from each other, generation of conductive foreign substances, which are generated by the positive-electrode side bus bar 31 cut by the fastening members, can be suppressed. In the first embodiment, the positive-electrode side bus bar 31 is arranged at a lower side at the time of fastening so that the inner diameter of the through hole 31d of the positive-electrode side bus bar 31 is formed larger, but the present invention is not limited thereto. For example, when the inductor bus bar 41 is arranged at the lower side, the inner diameter of the through hole 41e of the inductor bus bar 41 may be formed larger than the inner diameter of the through hole 31d of the positive side bus bar 31.

Further, in the filter module 20, the first space 50a and the second space 50b of the case 50 are separated by the wall 50c from each other. With the configuration, different types of potting materials can be used in the first space 50a in which the capacitor module 30 is accommodated, and in the second space 50b in which the inductor module 40 is accommodated. As a result, appropriate potting materials can be filled according to the accommodated capacitor module 30 and the inductor module 40 so that a property of each module can be optimized and stabilized.

In the first embodiment, opening directions of the first space 50a and the second space 50b of the case 50 are the same, but the directions may be set to be opposite to each other. Consequently, freedom of component layout as the power conversion device 1 can be enhanced. As a result, spaces are used effectively and downsizing of the power conversion device 1 can be achieved. In the case in which the opening directions of the first space 50a and the second space 50b are the same, when different potting materials are filled in the first space 50a and the second space 50b, there is no need to change an orientation of the case 50 so that a potting process can be simplified, and productivity is improved. Further, wirings can be connected to a vicinity of a component mount surface of the power conversion device 1 so that the wirings can be shortened, and the power conversion device 1 can be thin in thickness and small in size.

Further, in the inductor module 40, the silicon-based potting resin is used so that a brittle material such as ferrite forming the core 42 can be prevented from being cracked at the time of heat cycle. As a result, a property of the inductor module 40 can be stabilized and long-term reliability can be secured.

Further, the notches 50g are formed on both side surfaces of the second space 50b of the case 50, and the flat portions 41b and 41c of the inductor bus bar 41 of the inductor module 40 are arranged in the notches 50g. With the configuration, a height direction of the inductor module 40 is positioned, to thereby improve workability of assembling. Still further, a height dimension in the height direction of the filter module 20 can be suppressed.

Further, the bushes 51 are integrated by insert-molding in the fixing portions 50d of the case 50. When the case 50 is fixed to the housing, the fastening members such as screws are brought into contact with the metallic bushes 51. Thus, the fastening members are not in contact with the resin portions, creep of the resin can be suppressed. As a result, the case 50 can be stably fixed, and long-term durability and reliability can be secured.

Further, the positioning pins 50e, which are formed in the fixing portions 50d of the case 50, are engaged with the positioning holes formed in the housing. Thus, the filter module 20 can be positioned with respect to the housing. As a result, a property of the power conversion device 1 can be stabilized, and further, workability at the time of assembly and productivity can be improved.

Further, in the inductor module 40, the gap sheet 46b is arranged on the core 42 of a component. With the configuration, even when a large current flows in a secondary-side circuit of the power conversion device 1, the inductor module 40 is not magnetically saturated as an inductor. As a result, performance of the inductor module 40 can be stabilized.

Further, the inductor bus bar 41 is formed by insert-molding in the resin portions 41g. Accordingly, when the core 42 is mounted to the inductor bus bar 41, the core 42 is brought into abutment with the resin portions 41g. As a result, the core 42 is prevented from being damaged by coming into contact with the inductor bus bar 41, and the inductor bus bar 41 can be protected.

Furthermore, the resin portions 41g are integrated with the inductor bus bar 41 by insert-molding so that a process for mounting separate components can be eliminated, productivity and component dimensional accuracy are improved, and machining cost can be reduced.

In the inductor bus bar 41, the straight portion 41a is exposed from the resin. Further, at the portion at which the resin portions 41g and the core 42 come into contact with each other, the stepped portions 45a and 46a are formed in the core 42. With the configuration, the cross-sectional area of the core 42 can be increased on the straight portion 41a, and downsizing of the core 42 can be achieved while desired inductance and impedance can be obtained.

At the straight portion 41a, when there is a fear in that the inductor bus bar 41 is brought into contact with the core 42, the inductor bus bar 41 may be protected with a tape or the like. When the desired inductance and impedance are sufficiently secured, and the cross-sectional area of the core 42 is not required to be increased, the entire straight portion 41a may be coated with resin. In that case, the straight portion 41a is not required to be protected with the tape or the like, and the productivity is improved.

Further, in the inductor bus bar 41, the portions, which are formed by insert-molding in the resin portions 41g, may be formed with holes. With the configuration, the resin is filled into the holes of the bus bar, and adhesive strength between the bus bar and the resin can be improved by anchor effect.

Further, after the core 42 is mounted, the tape 43 is wound around the core 42. With the configuration, the core 42 can be temporarily fixed, and workability in post-processes can be improved. Still further, when the clip 44 is mounted in a post-process, the core 42 can be protected.

After the tape 43 is wound, the clip 44 is mounted to fix the core 42 on the inductor bus bar 41. With the configuration, a change of a gap length during or after assembly of the inductor bus bar 41 can be prevented, and a product property and long-term reliability can be stabilized. Further, the metallic clip 44 is brought into contact with the core 42 so that heat of the core can be dissipated via the clip 44.

In the first embodiment, the inductor bus bar 41 and the core 42 are separate components, but the present invention is not limited thereto. For example, the core 42 and the inductor bus bar 41 may be integrated by insert-molding. In that case, the tape 43 and the clip 44 are not required, and assembly processes can be reduced.

When the filter module 20 is mounted to the power conversion device 1, a wiring bus bar, which is not illustrated, is arranged for the capacitors 152 of the filter circuit 150 at a lower portion of the flat portion 41b of the inductor module 40. Further, the rising portion 41f is formed in the flat portion 41b of the inductor module 40. With the configuration, in a case in which the filter module 20 is assembled to the power conversion device 1, when the wiring bus bar is attempted to be assembled to an upper portion of the flat portion 41b of the inductor module 40 by mistake, the wiring bus bar is brought into contact with the rising portion 41f and cannot be fixed. As a result, a mistake when the filter module 20 is assembled can be prevented. The rising portion 41f may be formed in the flat portion 41c.

In the first embodiment, the filter module 20 is formed by the smoothing capacitor 142 and the inductor 151 as an additional filter component in the circuit diagram of FIG. 1, but the filter module 20 may be formed to include the plurality of capacitors 152 in the circuit diagram of FIG. 1.

In the first embodiment, the power conversion device 1 has been described as a step-down DC/DC converter, but the present invention is not limited thereto. For example, the power conversion device 1 may be an inverter for driving a motor, an onboard charger, or another inverter or converter.

Second Embodiment

A filter module 20 of the power conversion device 1 according to a second embodiment differs from the filter module 20 of the first embodiment in shapes of a positive-electrode side bus bar 31 of a capacitor module 30 and an inductor bus bar 41. Other configurations are the same as those of the first embodiment.

Figure 14:
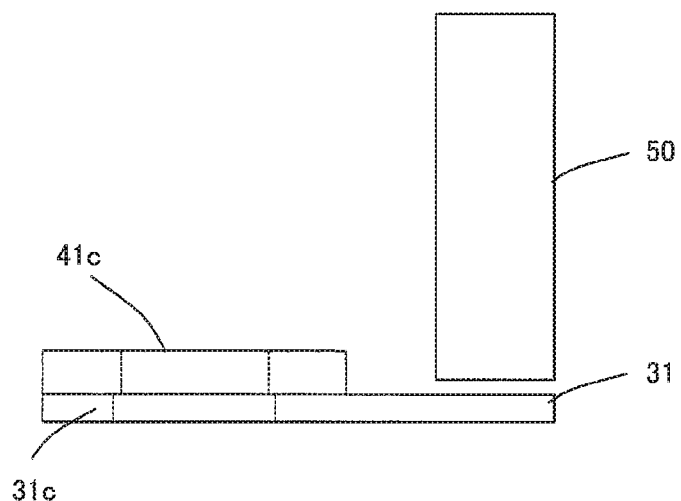
FIG. 14 is a view of a positive-electrode terminal of a positive-electrode side bus bar and an input terminal of the inductor bus bar forming the capacitor module of the first embodiment, when viewed from a side.
Figure 15:
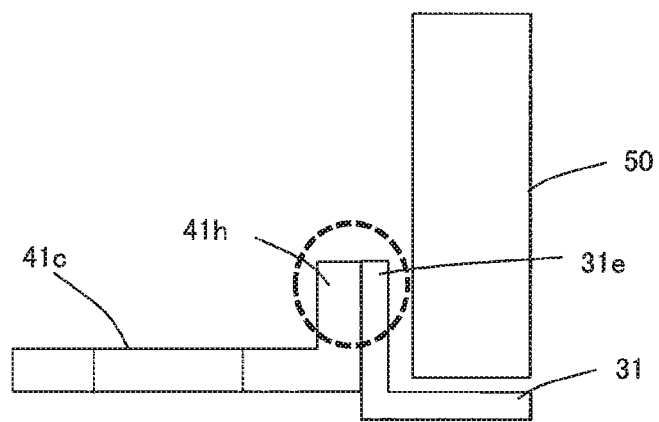
FIG. 15 is a view of a positive-electrode terminal of a positive-electrode side bus bar forming a capacitor module and an input terminal of an inductor bus bar of a second embodiment of the present invention, when viewed from a side.

FIG. 14 is a view for illustrating the fixing portion 31c of the positive-electrode side bus bar 31, which forms the capacitor module 30 of the first embodiment, and the flat portion 41c of the inductor bus bar 41, when viewed from a side. FIG. 15 is a view for illustrating a fixing portion 31c of a positive-electrode side bus bar 31, which forms the capacitor module 30 of the second embodiment, and a flat portion 41c of an inductor bus bar 41, when viewed from the side.

As illustrated in FIG. 15, in the filter module 20 according to the second embodiment, the positive-electrode side bus bar 31 of the capacitor module 30 is not overlapped with, but is made adjacent to the flat portion 41c of the inductor bus bar 41. A bent portion 41h is formed in the flat portion 41c of the inductor module 40, and a bent portion 31e is formed in the positive-electrode side bus bar 31 of the capacitor module 30. The bent portion 41h and the bent portion 31e are brought in abutment with each other to be bonded.

Accordingly, man-hours for fastening the inductor bus bar 41 to the positive-electrode side bus bar 31 of the capacitor module 30 can be reduced, and poor connection caused by loosened fastening members is eliminated. As a result, reliability of the power conversion device 1 can be secured, and quality thereof can be stabilized.

Further, the inductor bus bar 41 and the positive-electrode side bus bar 31 of the capacitor module 30 are bonded by welding or soldering so that electric resistance of the contact portions can be greatly reduced. Accordingly, when a large current flows, performance degradation and failure of the power conversion device 1 due to local heat generation can be prevented. As a result, quality of the power conversion device 1 can be stabilized.

The bent portion 41h of the inductor module 40 and the bent portion 31e of the positive-electrode side bus bar 31 of the capacitor module 30 are formed in a flat surface. Thus, the bonded portion is formed in a parallel plane, and magnetic flux generated during conduction is canceled. As a result, parasitic inductance the bent portion can be reduced.

Figure 16:
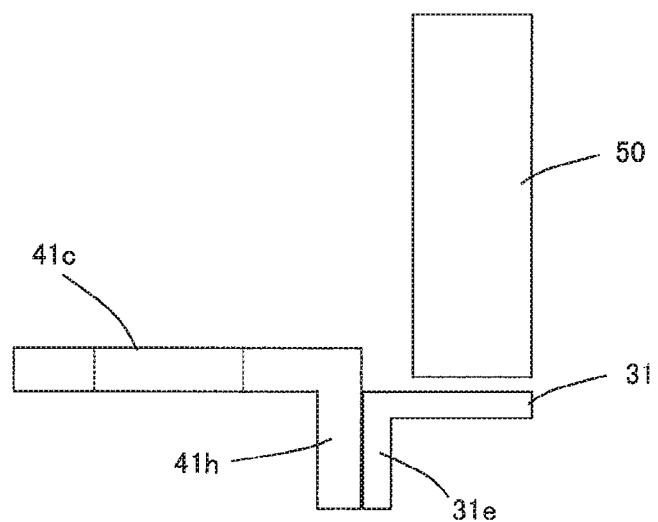
FIG. 16 is a view of a positive-electrode terminal of a positive-electrode side bus bar forming a modification example of a capacitor module and an input terminal of an inductor bus bar of the second embodiment of the present invention, when viewed from a side.

In FIG. 15, the bonded portion including the bent portion 41h and the bent portion 31e is brought to close to the case 50, but the bonded portion may be bonded and bent in a direction away from the case 50 as in a modification example illustrated in FIG. 16.

Third Embodiment

Figure 17:
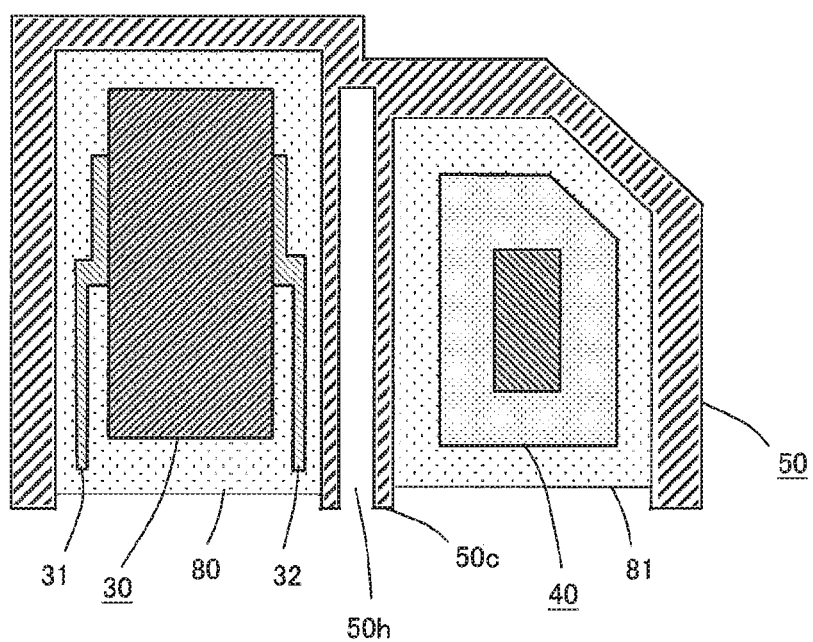
FIG. 17 is a view for illustrating a cross-section of a filter module of a power conversion device according to a third embodiment of the present invention.

FIG. 17 is a sectional view of a filter module 20 according to a third embodiment. The filter module 20 according to the third embodiment differs from the first embodiment in a structure of a wall 50c of a case 50. Other configurations are the same as those in the first embodiment.

As illustrated in FIG. 17, the wall 50c, which is formed between a capacitor module 30 and an inductor module 40, has a space 50h therein. The space 50h, which is formed between the capacitor module 30 and the inductor module 40, having air therein, reduces thermal conductivity. Thus, the space 50h formed in the wall 50c of the case 50 can further suppress an increase in temperature caused by thermal interference between the capacitor module 30 and the inductor module 40. As a result, an increase in temperature of the entire filter module 20 can be suppressed, and performance of the power conversion device 1 can be stabilized.

In the third embodiment, the space 50h has been formed in the wall 50c, but the present invention is not limited thereto. For example, as in a modification example illustrated in FIG. 18, a metal plate 19, which is made of aluminum or copper, having high thermal conductivity, may be arranged by insert-molding in the wall 50c. The metal plate 19 can also has the same effect as the space 50h.

Figure 18:
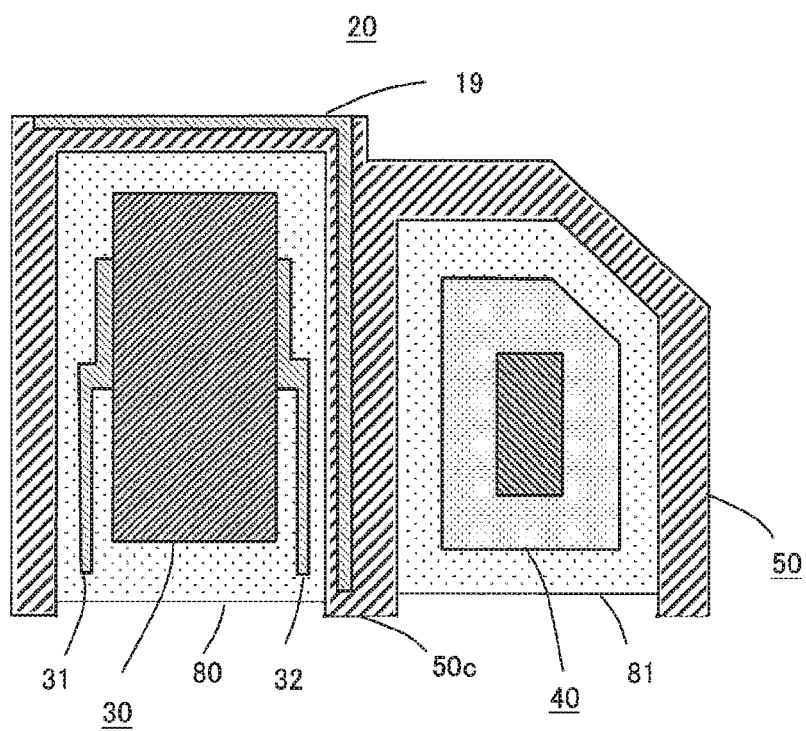
FIG. 18 is a view for illustrating a cross-section of a filter module in a modification example of a power conversion device according to the third embodiment of the present invention.

Further, as illustrated in FIG. 18, the metal plate 19 may be bent and extended toward a bottom surface side from the wall 50c of the case 50 to be exposed outside the case 50. In that case, heat loss from the capacitor module 30 and the inductor module 40 can be efficiently dissipated outside. The metal plate 19 may not be exposed from a surface of the case 50. Still further, the metal plate 19 may be bent in a direction on the capacitor module 30 side or on the inductor module 40 side, or may be divided on both sides.

Fourth Embodiment

Figure 19:
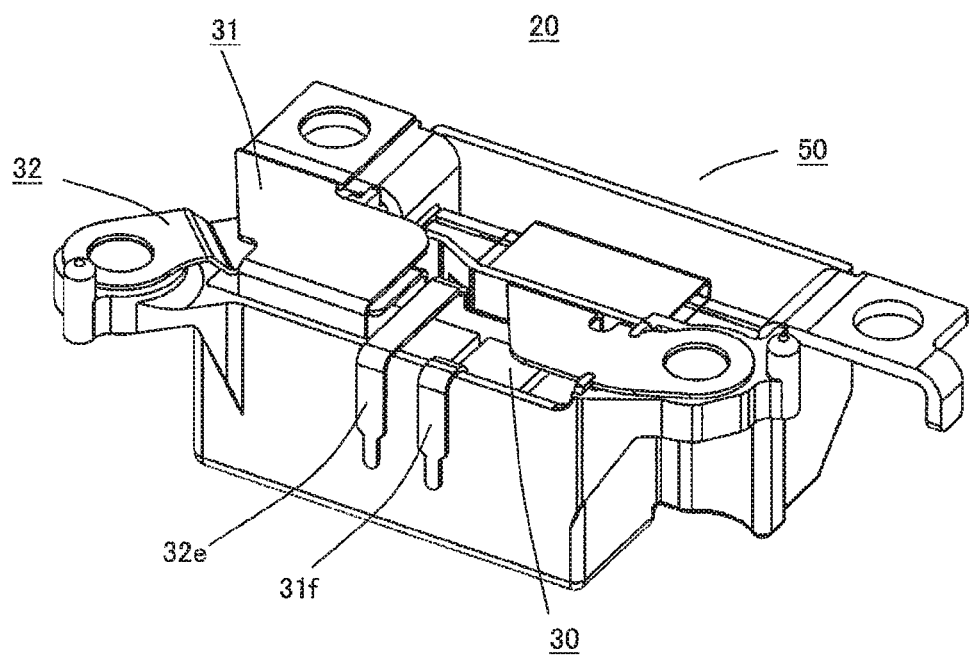
FIG. 19 is a perspective view of a filter module of a power conversion device according to a fourth embodiment of the present invention, when viewed from the bottom side.
Figure 20:
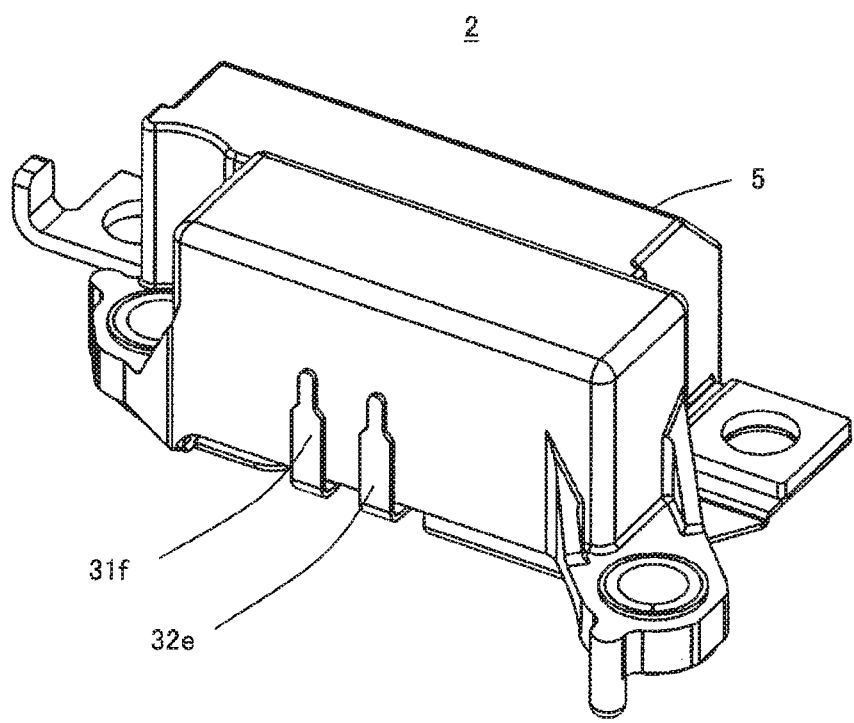
FIG. 20 is a view of the filter module of the power conversion device according to the fourth embodiment of the present invention, when viewed from the upper side.

FIG. 19 and FIG. 20 are perspective views of filter module 20 according to a fourth embodiment. The filter module 20 according to the fourth embodiment differs from the filter module 20 of the first embodiment in shapes of a positive-electrode side bus bar 31 and a negative-electrode side bus bar 32 of a capacitor module 30. Other configurations are the same as those in the first embodiment.

As illustrated in FIG. 19 and FIG. 20, an extension terminal 31f is formed in the positive-electrode side bus bar 31, and an extension terminal 32e is formed in the negative-electrode side bus bar 32 of the capacitor module 30. The extension terminal 31f and the extension terminal 32e each extend outside the case 50. The extension terminal 31f and the extension terminal 32e are inserted into through holes of a control board, which is not illustrated, arranged around a mount portion of the filter module 20, and are connected to the control board by soldering.

In the power conversion device 1 as a step-down DC/DC converter, an output voltage is detected by a sensor, and a piece of sensor information is input to the control board to execute feedback control. The sensor is generally connected to the control board by a harness or the like, in which a positive-electrode side of the sensor is connected to a vicinity of a B-terminal on an output side in the circuit diagram of FIG. 1, and a GND terminal of the sensor is connected to the housing. However, an additional component such as a harness is required, and hence spaces for connecting the terminals are required.

According to the filter module 20 of the fourth embodiment, the extension terminal 31f and the extension terminal 32e are formed in the positive-electrode side bus bar 31 and the negative-electrode side bus bar 32 of the capacitor module 30, which corresponds to the smoothing capacitor 142 arranged around the B-terminal, and are connected to the control board. With the configuration, an output voltage can be detected via those extension terminal 31f and the extension terminal 32e. As a result, it is possible to detect an output voltage without requiring an additional component such as a harness, to reduce the number of components, to downsize the power conversion device 1, and to achieve a cost reduction.

In the present invention, the embodiments may be appropriately modified within a scope of the present invention, and a portion of the present invention can be partially omitted.

In the present invention, the inductor module 40 has been formed as an inductor to be a passive element configured to store magnetic energy generated by current, but a coil can be applied as a component.

Further, the core 42 of the inductor module 40 has been formed, in the present invention, by the combination of the U-shaped core 45 and the I-shaped core 46, but the present invention is not limited thereto. For example, combinations other than the combination of the U-shape and the I-shape may be applied as long as the core can be wound around the bus bar.

REFERENCE SIGNS LIST 1 power conversion device, 19 metal plate, 20 filter module, 30 capacitor module, 31 positive-electrode side bus bar, 31a body portion, 31b bonding portion, 31c fixing portion (positive-electrode terminal), 31d through hole, 31e bent portion, 31f extension terminal, 32 negative-electrode side bus bar, 32a body portion, 32b bonding portion, 32c fixing portion (negative-electrode terminal), 32d through hole, 32e extension terminal, 40 inductor module, 41 inductor bus bar, 41a straight portion, 41b flat portion (output terminal), 41c flat portion (input terminal), 41d, 41e through hole, 41f rising portion, 41g resin portion, 41h bent portion, 42 core, 43 tape, 44 clip, 45 U-shaped core, 45a, 46a stepped portion, 46 I-shaped core, 46b gap sheet, 46c chamfered portion, 50 case (case member), 50a first space, 50b second space, 50c wall, 50d fixing portion, 50e positioning pin, 50f chamfered portion, 50g notch, 50h space, 50m, 50n protruding portion, 51 bush, 60, 61 potting material, 80 capacitor element, 80a, 80b electrode surface, 100 input filter circuit unit, 110 switching circuit unit, 120 transformer unit, 130 rectifier circuit unit, 140 smoothing circuit unit, 150 filter circuit unit

The invention claimed is:

1. A filter module for a power conversion device, comprising:
a capacitor module,
an inductor module, and
a case member,
wherein the capacitor module includes:
a positive-electrode side bus bar in which a positive-electrode terminal is formed,
a negative-electrode side bus bar in which a negative-electrode terminal is formed, and
a plurality of capacitor elements connected to the positive-electrode side bus bar and the negative-electrode side bus bar, respectively,
wherein the inductor module includes:
an inductor bus bar, and a magnetic member through which the inductor bus bar is inserted,
wherein the case member includes:
a first space in which the capacitor module is accommodated, and
a second space in which the inductor module is accommodated, and
wherein, when the capacitor module is accommodated in the first space and the inductor module is accommodated in the second space, the negative-electrode side bus bar of the capacitor module is arranged on the inductor module side.

2. The filter module for a power conversion device according to claim 1, wherein the negative-electrode side bus bar includes a plurality of the negative-electrode terminals.

3. The filter module for a power conversion device according to claim 1,
wherein the case member includes a wall between the first space and the second space.

4. The filter module for a power conversion device according to claim 1,
wherein the inductor bus bar includes an input terminal and an output terminal, and
wherein the input terminal is overlapped with the positive-electrode terminal of the positive-electrode side bus bar.

5. The filter module for a power conversion device according to claim 4,
wherein the input terminal and the positive-electrode terminal, which are in a state of being overlapped with each other, are fixed to the power conversion device with a fastening member,
wherein, between the input terminal and the positive-electrode terminal, a thickness of a terminal in contact with the fastening member is thicker than a thickness of another terminal.

6. The filter module for a power conversion device according to claim 3,
wherein the first space and the second space are open in the same direction.

7. The filter module for a power conversion device according to claim 1,
wherein the case member has a notch in an opening of the second space.

8. The filter module for a power conversion device according to claim 1,
wherein the inductor bus bar includes an input terminal, and
wherein the input terminal is arranged at a position adjacent to the positive-electrode terminal of the positive-electrode side bus bar, and is bonded to a bent portion of the positive-electrode terminal.

9. The filter module for a power conversion device according to claim 1,
wherein the inductor bus bar includes a rising portion on one end side.

10. The filter module for a power conversion device according to claim 1,
wherein the case member includes a protruding portion which regulates movement of the inductor bus bar.

11. The filter module for a power conversion device according to claim 3,
wherein the case member has a space in the wall.

12. The filter module for a power conversion device according to claim 3,
wherein the case member has a metal plate in the wall.

13. The filter module for a power conversion device according to claim 1,
wherein, when the capacitor module is accommodated in the first space of the case member, the positive-electrode side bus bar and the negative-electrode side bus bar of the capacitor module each include bus bar extension portions which extend outside the first space.

14. The filter module for a power conversion device according to claim 1,
wherein a portion of the inductor bus bar of the inductor module is formed in a resin member by insert-molding.

15. The filter module for a power conversion device according to claim 1,
wherein, when the positive-electrode side bus bar and the negative-electrode side bus bar are connected to the plurality of capacitor elements, the positive-electrode terminal and the negative-electrode terminal are arranged to cross in three-dimension with each other.

16. The filter module for a power conversion device according to claim 4,
wherein the inductor bus bar includes a rising portion on one end side.

17. The filter module for a power conversion device according to claim 4,
wherein the case member includes a protruding portion which regulates movement of the inductor bus bar.

18. A filter module for a power conversion device, comprising:
a capacitor module,
an inductor module, and
a case member,
wherein the capacitor module includes:
a positive-electrode side bus bar in which a positive-electrode terminal is formed,
a negative-electrode side bus bar in which a negative-electrode terminal is formed, and
a plurality of capacitor elements connected to the positive-electrode side bus bar and the negative-electrode side bus bar, respectively,
wherein the inductor module includes:
an inductor bus bar, and a magnetic member through which the inductor bus bar is inserted,
wherein the case member includes:
a first space in which the capacitor module is accommodated, and
a second space in which the inductor module is accommodated, and
wherein, when the positive-electrode side bus bar and the negative-electrode side bus bar are connected to the plurality of capacitor elements, the positive-electrode terminal and the negative-electrode terminal are arranged to cross in three-dimension with each other.

19. A filter module for a power conversion device, comprising:
a capacitor module,
an inductor module, and
a case member,
wherein the capacitor module includes:
a positive-electrode side bus bar in which a positive-electrode terminal is formed,
a negative-electrode side bus bar in which a negative-electrode terminal is formed, and
a plurality of capacitor elements connected to the positive-electrode side bus bar and the negative-electrode side bus bar, respectively,
wherein the inductor module includes:
an inductor bus bar, and a magnetic member through which the inductor bus bar is inserted,
wherein the case member includes:
a first space in which the capacitor module is accommodated, and
a second space in which the inductor module is accommodated,
wherein the case member comprises a case fixing portion with which the case member is fixed to the power conversion device, and wherein the negative-electrode terminal is fixed to the power conversion device together with the case fixing portion.

20. The filter module for a power conversion device according to claim 19,
wherein the negative-electrode terminal has a through hole,
wherein the case fixing portion has a fixing hole, and
wherein the through hole is larger than the fixing hole.

21. The filter module for a power conversion device according to claim 19,
wherein the negative-electrode side bus bar includes a plurality of the negative-electrode terminals.

* * * * *